United States Patent
Berneth et al.

(10) Patent No.: US 7,214,752 B2
(45) Date of Patent: *May 8, 2007

(54) HOMOPOLYMERS WHICH EXHIBIT A HIGH LEVEL OF PHOTO-INDUCABLE BIREFRINGENCE

(75) Inventors: Horst Berneth, Leverkusen (DE); Uwe Claussen, Leverkusen (DE); Serguei Kostromine, Swisttal (DE); Ralf Neigl, Leverkusen (DE); Hans-Joachim Vedder, Puchheim (DE)

(73) Assignee: Bayer MaterialScience AG, Leverkusen (DE)

( * ) Notice: Subject to any disclaimer, the term of this patent is extended or adjusted under 35 U.S.C. 154(b) by 217 days.

This patent is subject to a terminal disclaimer.

(21) Appl. No.: 10/998,381

(22) Filed: Nov. 29, 2004

(65) Prior Publication Data

US 2005/0070678 A1 Mar. 31, 2005

Related U.S. Application Data

(60) Continuation of application No. 10/190,293, filed on Jul. 3, 2002, now Pat. No. 6,875,833, which is a division of application No. 09/423,499, filed on Nov. 8, 1999, now Pat. No. 6,441,113.

(30) Foreign Application Priority Data

May 15, 1997 (DE) ................................ 197 20 288

(51) Int. Cl.
*C08F 114/18* (2006.01)

(52) U.S. Cl. .................. 526/243; 526/257; 526/261; 526/286; 526/288; 526/298; 526/304; 526/307; 526/311; 526/312

(58) Field of Classification Search ................ 526/243, 526/257, 261, 286, 288, 298, 304, 307, 311, 526/312
See application file for complete search history.

(56) References Cited

U.S. PATENT DOCUMENTS

| | | | |
|---|---|---|---|
| 4,631,328 A | 12/1986 | Ringsdorf et al. | 526/259 |
| 4,943,617 A | 7/1990 | Etzbach et al. | 525/329.9 |
| 5,023,859 A | 6/1991 | Eich et al. | 365/113 |
| 5,173,381 A | 12/1992 | Natansohn et al. | 430/19 |
| 5,412,079 A | 5/1995 | Furukawa et al. | 534/732 |

*Primary Examiner*—Bernard Lipman
(74) *Attorney, Agent, or Firm*—Joseph C. Gil; Aron Preis

(57) ABSTRACT

Homopolymers suitable for storage of information provided optically are disclosed. The are formed from monomers which
  contain groupings which are at least trinuclear, which are capable of absorbing the electromagnetic radiation of visible light, and which are structured so that in their thermodynamically stable state they are distended and strongly anisometric,
  wherein the at least trinuclear groupings comprise at least one electron-attracting substituent which gives rise to a dipole moment which forms an angle of at least 20° with the longitudinal axis of the at least trinuclear groupings,
  wherein the at least trinuclear groupings contain at least one nucleus-linking group which is suitable for a photo-induced change in configuration, wherein said group is selected from the set consisting of

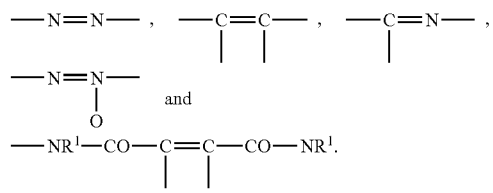

3 Claims, No Drawings

HOMOPOLYMERS WHICH EXHIBIT A HIGH LEVEL OF PHOTO-INDUCABLE BIREFRINGENCE

CROSS REFERENCE TO RELATED PATENT APPLICATIONS

The present patent application is a Continuation, and claims the right of priority under 35 U.S.C. § 120 of U.S patent application Ser. No. 10/190,293, filed Jul. 3, 2002, now U.S. Pat. No. 6,875,833, which is a Divisional under 35 U.S.C. § 121 of U.S. patent application Ser. No. 09/423,499, filed Nov. 8, 1999, now U.S. Pat. No. 6,441,113 B1.

FIELD OF THE INVENTION

The invention relates to polymers comprising photo-addressable side groups, in which a high level of birefringence can be induced by irradiation, so that they are suitable for the storage of information which is provided optically or are suitable as passive or optically switchable components.

BACKGROUND OF THE INVENTION

Various polymers comprising photochromic groups are known from the literature: the special peculiarity thereof is that their optical properties, such as absorption, emission, reflection, birefringence and scattering, can be induced by light and can be varied reversibly. Polymers of this type have a special branched structure: side groups which are capable of absorbing electromagnetic radiation are seated—via parts of molecules which act as spacers—on a linear backbone. The interest of experts in this field has recently been directed towards side group polymers such as these which comprise side groups of different types, one type of which is capable of absorbing electromagnetic radiation whilst the other type is a mesogenic group, the shape of which is anisotropic. Liquid crystalline side group polymers of this type are described in U.S. Pat. Nos. 4,631,328 and 4,943,617, for example. In their unoriented state, films of these polymers are turbid and scatter light; these films do not become clear and transparent until they are aligned.

Amorphous polymers which are suitable for storing optical information are known from DE-OS 38 10 722 and U.S. Pat. No. 5,173,381. These have the technical advantage that films made of these polymers exhibit usable optical properties immediately after they are produced.

Homopolymers are seldom mentioned in this connection. EP-A 617 110 describes azo-containing carbaminates which are rendered polymerisable by N-acylation with (meth) acrylic acid. In actuality, homopolymers are generally inferior to copolymers.

The only processes which have been described hitherto for the reversible storage of information are those where deletion of the information is effected by raising the temperature, and can be effected both by heat and by light. Moreover, deletion by light can exhibit the advantage that the process is limited to a defined location, which is why this variant is preferred. In general, it can be stated that on raising the temperature the property of retaining stored information is lost. The known compounds therefore have the disadvantage that the birefringence effects which are written in are not thermally stable. At elevated temperatures, particularly at temperatures approaching the glass transition temperature, birefringence becomes less pronounced and finally disappears completely. There is therefore a need for information storage media for which the stability of written information is as insensitive to temperature as possible.

SUMMARY OF THE INVENTION

Surprisingly, it has now been found that superior side chain polymers which are suitable for the production of photo-addressable information storage media can be produced if monomers are homopolymerised, which
contain groupings which are at least trinuclear, which are capable of absorbing the electromagnetic radiation of visible light, and which are structured so that in their thermodynamically stable state they are distended and strongly anisometric,
wherein the at least trinuclear groupings comprise at least one, preferably at least two, electron-attracting substituent(s) which give(s) rise to a dipole moment which forms an angle of at least 20° preferably at least 30°, with the longitudinal axis of the at least trinuclear groupings.

DETAILED DESCRIPTION OF THE INVENTION

Thermally stable grey scales can be written into these new polymers under the effect of light.

In principle, at least two methods of influencing the dipole moment are possible, namely
substitution with lateral, electron-attracting substituents which are disposed unsymmetrically with respect to the longitudinal axis of the grouping, and
the use of nucleus-linking polar groups, the dipole moments of which do not point in the direction of their longitudinal axis.

Groups which are capable of forming hydrogen bonds with each other, such as —NH—CO— and —OC—NH— for example, are particularly preferred in this respect.

The expression "electromagnetic radiation of visible light" should be understood to mean light with a wavelength range from 350 to 750 nm.

The expression "thermodynamically stable state" should be understood in the sense of the present invention to mean the lowest energy configuration, such as that which occurs in the dark in a dissolved state in an organic solvent, for example. When cis/trans isomerism exists, such as that which occurs with stilbenes and azo compounds for example, the trans isomer is the isomer of lower energy in each case. The configuration which is present can be determined spectroscopically from the absorption bands.

"Distended" in the sense of the present invention is to be understood to mean a state in which the at least trinuclear groupings are situated within a cylinder with a length/diameter ratio of 2.5, preferably 3, wherein the length of the cylinder is identical to the length of the at least trinuclear grouping.

"Strictly anisometric" in the sense of the present invention means a structure in which none of the nuclei is directly or indirectly bonded (i.e. via a bonding group without a nucleus) to the next nucleus. i.e. it preferably (for trinuclear groupings) means a structure where the middle nucleus is a 6-membered ring which is directly or indirectly bonded via its 1- and 4-positions to the adjacent nuclei.

"Electron-attracting substituent" in the sense of the present invention is to be understood to mean substituents which reduce the basicity, i.e. the electron density, of the nucleus on which they are situated, due to induction and/or mesomeric effects. These substituents preferably comprise alkylcarbonyl, carboxyl, alkoxycarbonyl, carbamido, carboxylamino, cyano, nitro and ammonium, and—less preferably—comprise the halogens.

"Lateral" in the sense of the present invention can be explained by citing the example of an azobenzene group, and denotes that the substituent forms an angle with the longitudinal axis of the azobenzene and is therefore situated in the o- and/or m-position, whilst a substituent in the p-position is not considered as being "lateral" in the sense of the invention. If a phenyl radical of the azobenzene is replaced by a five-membered ring, for example, the substituents are "lateral" in all conceivable positions, because on a five-membered ring there is no position corresponding to the p-position on a 6-membered ring.

In principle, all groups which contain carboxyl groups are suitable as nucleus-linking polar groups, the dipole moment of which is at least 200. This can be well illustrated by using the amide group as an example:

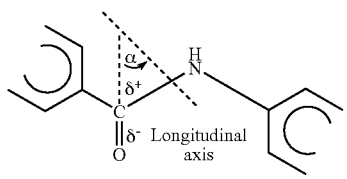

(II)

The orientation of the dipole moment of the carboxyl group forms an angle α with the longitudinal axis which is at least 20°.

The present invention also relates to homopolymers, formed from monomers which contain groupings which are at least trinuclear, which are capable of absorbing the electromagnetic radiation of visible light, and which are structured so that in their thermodynamically stable state they are distended and strongly anisometric, wherein the at least trinuclear groupings comprise at least one electron-attracting substituent which gives rise to a dipole moment which forms an angle of at least 20° with the longitudinal axis of the at least trinuclear groupings.

The preferred groupings which are at least trinuclear are those which contain at least two aromatic nuclei.

The, preferred polymers according to the invention contain, on a main chain which acts as a backbone, covalently bonded side groups which branch therefrom, of formula

—S-T-Q-E (I), wherein

S denotes oxygen, sulphur or $NR^1$, $R^1$ denotes hydrogen or $C_1$–$C_4$ alkyl, T denotes a $(CH_2)_n$ radical, which can optionally be interrupted by —O—, —$NR^1$— or —$OSiR^1{}_2O$— and/or which can optionally be substituted by methyl or ethyl, n denotes the numbers 2, 3 or 4, Q denotes a radical comprising two bonds, and E denotes an at least trinuclear grouping which comprises the features according to the claims.

The function of the radical T is to ensure a certain spacing of the side group from the chain which acts as the backbone. It is therefore also termed a "spacer".

The radical Q links the terminal group E to the spacer T, which itself forms the bond to the main chain via bonding element S. The special feature of group Q is its influence firstly on E and secondly on the adjacent groups.

The preferred radicals Q comprise the groups —S—, $SO_2$—, —O—, —COO—, —OCO—, —$CONR^1$—, —$NR^1$—CO—, —$NR^1$— and $(CH_2)_m$, where m=1 or 2.

The at least trinuclear groupings E contain at least one nucleus-linking group which is suitable for a photo-induced change in configuration, such as

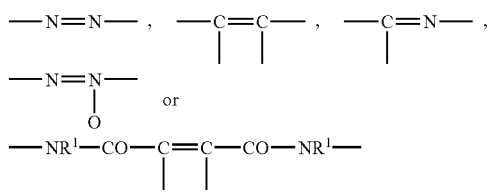

In addition to at least one group of variable configuration, the groupings E also contain other nucleus-linking groups, such as —C≡C—, —COO—, —OCO—, —$CONR^1$—, —$NR^1CO$— or a direct bond, wherein $R^1$ is preferably H and direct bonds are less preferred.

The at least 3 nuclei of E can each represent a 5- or 6-membered cycloaliphatic ring or a naphthalene radical, with the proviso that at least two nuclei, and preferably at least three nuclei, are aromatic.

Nuclei of E which are particularly preferred include 2,6-naphthylene and 1,4-phenylene, as well as heterocyclic radicals of structures

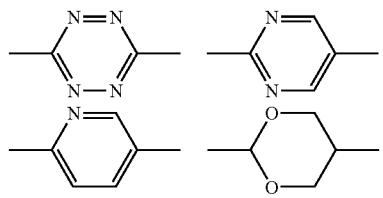

5-membered ring systems can be carbocyclic, but are preferably heteroaromatic and contain up to 3 hetero atoms, preferably from the series comprising S, N, O. Examples of suitable representatives include thiophene, thiazole, oxazole, triazole, oxadiazole and thiadiazole. Heterocycles comprising 2 hetero atoms are particular preferred.

The preferred groupings E contain cinnamic acid or stilbene radicals and azo dye radicals or analogues of a heterocyclic type, preferably mono- and diazo dye radicals.

The groupings E should be polarised. As described above, said polarisation can be effected by substitution with electron-attracting lateral substituents. The preferred substituents are those which have Hammett values of at least 0.5. The σ values are known from the literature; see C. Hansch, A. Leo, R. W. Taft, Chem. Rev, 1991 91 (165–195). If the nuclei are multiply-substituted, the number of substituents in each case depends on the number of possible positions of substitution, on the options for incorporating the substituents and on the properties of the substituted systems. The 2,4- and 3,4-positions on 6-membered rings are preferred; the preferred substituents are cyano and nitro.

Aromatic nuclei which are suitable for B preferably contain 6 to 14 C atoms in their aromatic ring, which can be singly- or multiply-substituted by $C_1$–$C_{12}$ alkyl, $C_1$–$C_{12}$ alkoxy, hydroxy, halogen (particularly F, Cl or Br), amino, nitro, trifluoromethyl, cyano, carboxy, COOR (R=$C_1$–$C_6$ alkyl, cyclohexyl, benzyl, phenyl), $C_5$–$C_{12}$ cycloalkyl, $C_1$–$C_{12}$ alkylthio, $C_1$–$C_6$ alkylsulphonyl, $C_6$–$C_{12}$ arylsulphonyl, aminosulphonyl, $C_1$–$C_6$ alkylaminosulphonyl, phenylaminosulphonyl, aminocarbonyl, $C_1$–$C_6$ alkylamino-carbonyl, phenylaminocarbonyl, $C_1$–$C_4$ alkylamino, di-$C_1$–$C_4$ alkylamino, phenylamino, $C_1$–$C_5$ acylamino, $C_1$–$C_4$ alkylsulphonylamino, mono- or di-$C_1$–$C_4$ alkylaminocarbonylamino, $C_1$–$C_4$ alkoxycarbonylamino or trifluoromethyl-sulphonyl.

Heterocyclic nuclei which are suitable for E preferably contain 5 to 14 ring atoms, 1 to 4 of which are hetero atoms from the series comprising nitrogen; oxygen and sulphur, wherein the heterocyclic ring system can be singly- or multiply-substituted by $C_1$–$C_{12}$ alkyl, $C_1$–$C_{12}$ alkoxy, hydroxy, halogen (particularly F, Cl or Br), amino, nitro, trifluoromethyl, cyano, carboxy, COOR(R=$C_1$–$C_6$alkyl, cyclohexyl, benzyl, phenyl), $C_5$–$C_{12}$ cycloalkyl, $C_1$–$C_{12}$ alkylthio, $C_1$–$C_6$ alkylsulphonyl, $C_6$–$C_{12}$ arylsulphonyl, aminosulphonyl, $C_1$–$C_6$ alkylaminosulphonyl, phenylaminosulphonyl, aminocarbonyl, $C_1$–$C_6$ alkylamino-carbonyl, phenylaminocarbonyl, $C_1$–$C_4$ alkylamino, di-$C_1$–$C_4$ alkylamino, phenylamino, $C_1$–$C_5$ acylamino, $C_1$–$C_4$ alkylsulphonylamino, mono- or di-$C_1$–$C_4$ alkylaminocarbonylamino, $C_1$–$C_4$ alkoxycarbonylamino or trifluoromethylsulphonyl.

Particularly preferred groupings E contain the following binuclear partial radicals: either one aromatic nucleus and one heterocyclic nucleus or two aromatic nuclei.

The preferred binuclear partial radicals are azobenzene radicals of formula

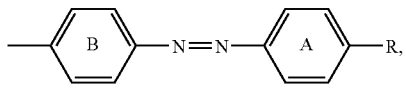

(III)

wherein

R represents a bond or nitro, or preferably represents a 4-substituted benzamido or cyano, and the rings A and B can be substituted in addition. If R represents cyano or nitro, ring A is preferably substituted in addition, wherein the substituent should have a a value of at least 0.5.

Azobenzene radicals which are particularly preferred correspond to the formula

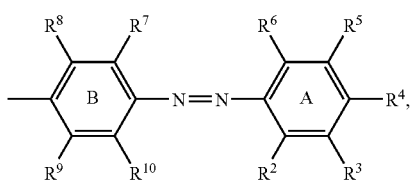

(IV)

wherein $R^2$ to $R^6$, independently of each other, represent hydrogen, chlorine, bromine, trifluoromethyl, methoxy, $SO_2CH_3$, $SO_2CF_3$, $SO_2NH_2$, preferably CN, 4-substituted benzamido or nitro, preferably with the proviso that at least two of these radicals are not hydrogen, wherein $R^4$ can additionally denote a single bond, and $R^7$ to $R^{10}$, independently of each other, denote hydrogen, chlorine or methyl.

If there is multiple substitution of ring A, the 2,4- and 3,4-positions are preferred.

Therefore, the preferred groupings E correspond to the formula

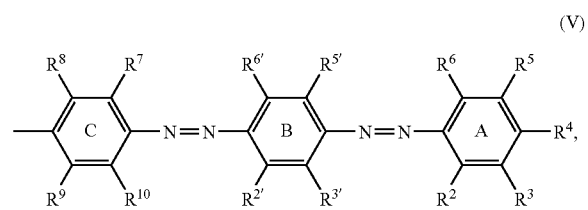

(V)

wherein $R^2$ to $R^6$ and $R^7$ to $R^{10}$ have the meanings given above, and $R^{2'}$ to $R^6$, the have meanings of $R^2$ to $R^6$, but are independent thereof.

Other binuclear partial radicals correspond to the formula

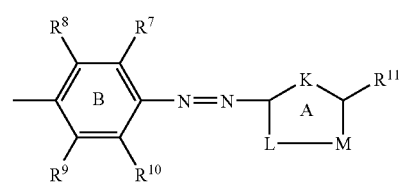

(VI)

wherein

K, L and M, independently of each other, denote the atoms N, S or O, or optionally denote —$CH_2$— or —CH=, with the proviso that at least of one of the members K, L or M is a hetero atom and ring A is saturated or contains 1 or 2 double bonds, and $R^2$, and $R^7$ to $R^{10}$, independently of each other, have the meanings given above.

Ring A preferably represents a thiophene, thiazole, oxazole, triazole, oxadiazole or thiadiazole radical.

Other preferred groups E correspond to the formula

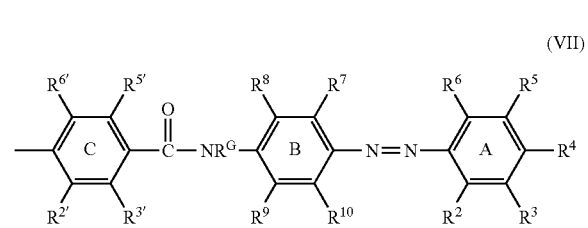

(VII)

wherein $R^2$ to $R^{10}$ and $R^{2'}$ to $R^{6'}$ have the meanings given above.

A common feature of the above formulae is that substitution of ring A in the 4-, 2,4- and 3,4-positions is particularly preferred.

Groupings E which are particularly preferred correspond to the formulae:

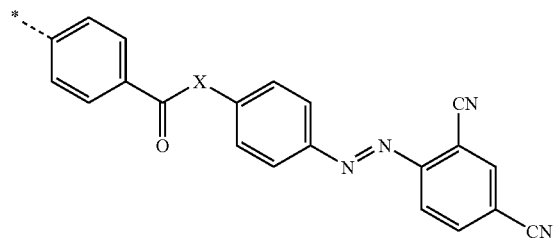

where X = O or NR¹

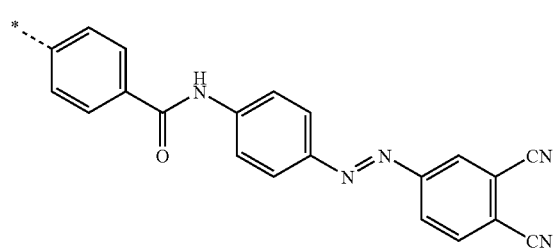

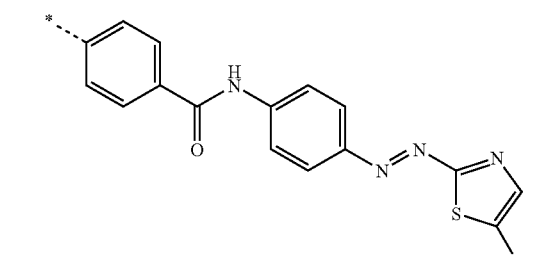

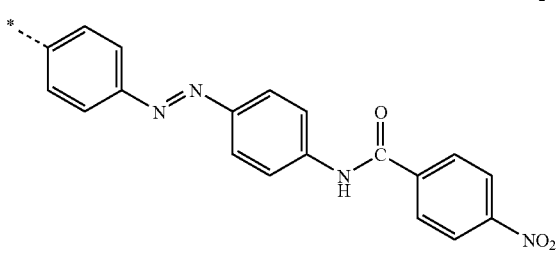

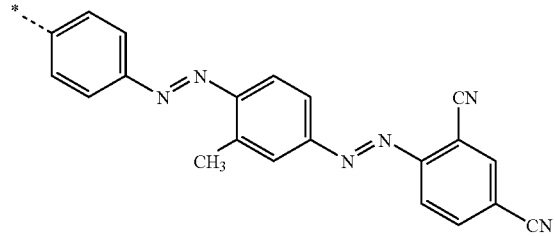

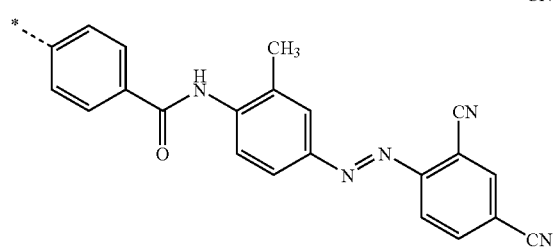

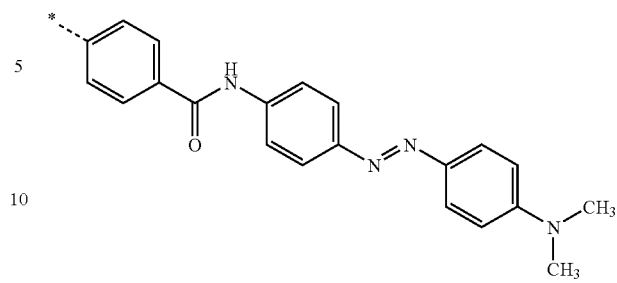

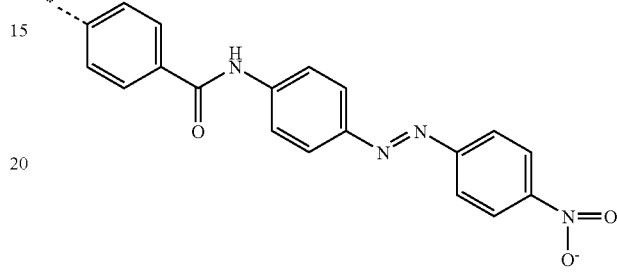

The polymers which are preferred according to the invention solely contain recurring units comprising side groups I, and preferably contain those of formula

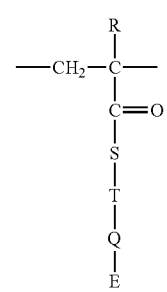
(VIII)

where R=H, or preferably where R=methyl.

The corresponding preferred monomers for the introduction of side groups I therefore correspond to the formula

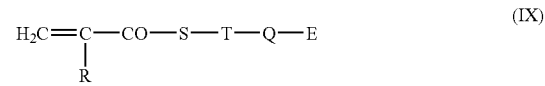
(IX)

The main chain of the side group polymers is therefore formed solely from monomers which comprise side groups (I).

The polymers according to the invention preferably have glass transition temperatures Tg of at least 40° C. The glass transition temperature can be determined as described by B. Vollmer, Grundriβ der Makromolekularen Chemie, pages 406 to 410, Springer-Verlag, Heidelberg 1962, for example.

In general, the polymers according to the invention have a molecular weight, determined as the weight average molecular weight, from 3000 to 2,000,000, preferably 5000 to 1,500,000, as determined by gel permeation chromatography (calibrated with polystyrene).

Due to the structure of the polymers, the intermolecular interactions of structural elements (I) are such that the formation of liquid crystalline states of order is suppressed, and optically isotropic, transparent, non-scattering films can be produced. On the other hand, the intermolecular interactions are nevertheless sufficiently strong so that irradiation with polarised light results in a photochemically induced, cooperative, directional reorientation process of the side groups.

Extremely high levels of optical anisotropy can be induced in the optically isotropic, amorphous polymers according to the invention by irradiating them with polarised light. The measured values of the change in birefringence range between 0.05 and 0.08.

The light which is preferably used is linearly polarised light, the wavelength of which falls within the region of the absorption bands of the side groups.

The production of side group monomers and the polymerisation thereof can be effected by methods which are known from the literature; see, for example, Makromolekulare Chemie 185, 1327–1334 (1984). SU 887 574, Europ. Polym. J. 18, 651 (1982) and Liq. Cryst. 2. 195 (1987), DD 276 297, and DE-OS 28 31 909 and 38 08 430. The polymers according to the invention are generally produced by radical-initiated polymerisation in suitable solvents, e.g. in aromatic hydrocarbons such as toluene or xylene, in aromatic halogenated hydrocarbons such as chlorobenzene, in ethers such as tetrahydrofuran or dioxane, in ketones such as acetone or cycloohexanone, and/or in dimethylformamide, in the presence of radical-forming polymerisation initiators. e.g. azobis(isobutyronitrile) or benzoyl peroxide, at elevated temperatures, generally from 40 to 70° C., if possible under water and with the exclusion of light. They can be isolated by precipitation in suitable media, e.g. methanol. The products can be purified by re-precipitation, e.g. with chloroform/methanol.

Isotropic films can be produced without costly orientation processes being necessary for which external fields and/or surface effects are required. They can be produced on substrates, by spin-coating, immersion, casting or by other coating methods which are easily controlled technologically, by pressing or flowing them between transparent plates, or can readily be produced as self-supporting films by casting or extrusion. Films such as these can be produced by sudden cooling, i.e. by employing a cooling rate >100 K/min, or can also be produced by rapidly stripping the solvent from liquid crystalline polymers which contain structural elements of the type described above.

The film thickness of films such as these preferably ranges between 0.1 µm and 1 mm, particularly between 0.1 and 100 µm.

When they are in their glassy state, the side group polymers according to the invention are optically isotropic, amorphous, transparent and do not scatter light, and are capable of forming self-supporting films.

However, they are preferably deposited on support materials, for example on glass or on plastics films. This can be effected by various known techniques, wherein the process is selected accordingly, depending on whether a thick or a thin film is required. Thin films can be produced, for example, by spin-coating or by doctor blade from solutions or from the melt, thicker layers can be produced by filling prefabricated cells, or by melt pressing or extrusion methods.

The polymers can be used for the storage of digital or analogue data in the widest sense, e.g. for optical signal processing, for Fourier transformation and convolution or for the coherent optical correlation technique. The lateral resolution is limited by the wavelength of the light used for writing. It enables a pixel size from 0.45 to 3000 µm to be obtained. A pixel size from 0.5 to 30 µm is preferred.

This property makes the polymers particularly suitable for the processing of images and for information processing by means of holograms, the reproduction of which can be effected by illumination with a reference beam. Similarly, the interference pattern of monochromatic light sources with a constant phase relationship can be stored. Three-dimensional holographic images can be stored correspondingly. Read-out is effected by illuminating the hologram with monochromatic coherent light. A storage density which is higher than that of a purely binary system can be achieved due to the relationship between the electric vector of the light and the preferred direction, which is associated therewith, in the storage medium. In analogue storage, values of the grey scale can be continuously adjusted, as can the local resolution thereof. Read-out of stored analogue information is effected in polarised light, wherein a negative or positive image can be retrieved depending on the position of the polarisers. The contrast between two polarisers which is produced by the phase shift between the ordinary and the extraordinary beam can firstly be used, wherein the planes of the polarisers advantageously form an angle of 45° to the plane of polarisation of the inscribing light and the plane of polarisation of the analyser is either perpendicular or parallel to that of the polariser. Another possibility is the detection of the angle of deviation of the read-out light which is caused by the induced birefringence.

The polymers can be used as optical components which can be passive or which can be actively switchable, particularly for holographic optics. Thus the high extent of light-induced optical anisotropy can be used for the electrical modulation of the intensity and/or of the state of polarisation of light. Components which have imaging properties which are comparable with those of lenses or gratings can accordingly be produced from a polymer film by a holographic structuring process.

Therefore, the present invention further relates to the use of the polymers described above for optical components.

Monomers IX are novel. Therefore, the present invention also relates to monomers IX.

Monomers IX can be produced by analogy with known reactions, e.g. by

A) the reaction of acid chlorides of formula

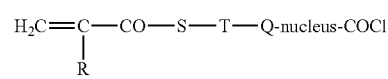

with 4-amino-binucleus compounds, e.g. 4-aminoazobenzenes, to form monomer IX, e.g. to form the compound of Example 2.1.1;

B) 1. By the condensation of
  a) 1,4-diamino nuclei, e.g. 1,4-phenylenediamine, with
  b) nucleus-acid chlorides, e.g. p-nitrobenzoyl chloride, to form
  c) a p-(nucleus-carboxamino)-nucleus-amine, e.g. N-(p-nitrobenzoyl)-1,4-phenylenediamine 2. Diazotisation of 1 c) and
3. Coupling with a compound of formula

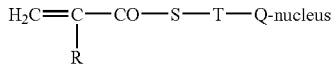

e.g. (meth)acrylic acid-1-(N-methylanilino)-ethyl ester, to form monomer IX, e.g. to form the compound of Example 2.4;

C) 1. diazotisation of a 4-amino binuclear, e.g. 4-aminoazobenzene,
2. Coupling with the (meth)acrylic acid ester

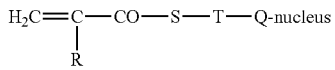

e.g. with (meth)acrylic acid-1-(N-methylanilino)-ethyl ester, to form monomer IX, e.g. to form the diazo compound of Example 2.5.

1–1.2 mol of the aminobinuclear compound per mol of acid chloride is preferably used for reaction A. The reaction can be conducted in solvents, wherein inert organic solvents comprising ethers, e.g. dioxane, are preferred. The reaction is preferably conducted at temperatures from 20 to 80° C.

The diazotisations for reactions B and C can be conducted in mineral acids such as hydrochloric acid, sulphuric acid or phosphoric acid for example, or can be conducted in carboxylic acids such as acetic acid or propionic acid, with sodium nitrite or nitrosylsulphuric acid as the nitrosylating agent, preferably at temperatures from –10 to +20, particularly 0 to +10° C. In general, the coupling component is placed in a vessel, optionally in a suitable solvent such as glacial acetic acid or methanol, the pH is adjusted to a value from 1 to 6, preferably from 3 to 4, and the temperature during the addition of the diazonium component is maintained at 0 to 30, preferably 5 to 10° C. The batch is then neutralised, with caustic soda or aqueous sodium carbonate solution for example, and is diluted with water, and the precipitated product is filtered off under suction.

The percentages given in the following examples are percentages by weight in each case unless indicated otherwise.

EXAMPLES

Example 1

Preparation of Polymers 1.1 Preparation of Monomers 1.1.1

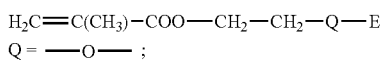

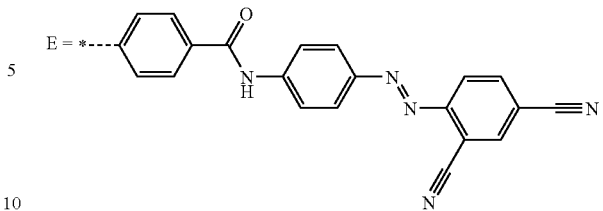

31.4 g 2,4-dicyanoaniline were diazotised with 72 g nitrosylsulphuric acid at 0 to 5° C. in 300 ml of 50% aqueous sulphuric acid and the batch was subsequently stirred for 1 hour. The reaction mixture was slowly added to a solution of 20.4 g aniline and 4.5 g urea in 300 ml 50% aqueous sulphuric acid, the temperature being held at 0° C. After stirring for a further 1 hour, the pH of the reaction mixture was adjusted to 5.5 with sodium carbonate, and the precipitate was filtered off under suction, washed with water, and dried. 34 g of red 4-amino-2',4'-dicyano-azobenzene were obtained. The product was used further without purification.

27.6 g 4-amino-2',4'-dicyano-azobenzene in 500 ml dioxane were added to a solution of 33 g 4-(2-methacryloyloxy)-ethoxy-benzoic acid chloride in 100 ml dioxane, the batch was stirred for 2 hours, and the product was precipitated by pouring the solution into 2 litres of water. The precipitate was filtered off under suction, dried, and purified by crystallising it twice from dioxane. The yield corresponded to 30.4 g of orange-red crystals with a f.p. of 215–217° C. $\lambda_{max}$=404.5 nm (DMF).

1.1.2

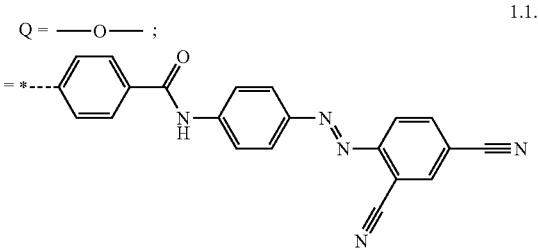

20.7 g 2,4-dicyanoaniline were diazotised with 48 g nitrosylsulphuric acid at 0 to 5° C. in a solution comprising 200 ml glacial acetic acid, 40 ml of 85% phosphoric acid and 7.5 ml of concentrated aqueous sulphuric acid, and the batch was subsequently stirred for 1 hour. The reaction mixture was slowly added to a solution of 16 g phenol and 3 g urea in 120 ml water, the temperature being held at 10° C. and the pH being maintained at 6.3–6.5 with caustic soda solution. After stirring for a further 1 hour, the precipitate was filtered off under suction, washed with water, dried, and recrystallised from toluene. 30.3 g of orange-red 4-hydroxy-2',4'-dicyano-azobenzene were obtained.

A solution of 18.1 g of 4-(2-methacryloyloxy)-ethoxy-benzoic acid chloride in 100 ml diethyl ether was slowly added to a solution of 16.6 g 4-hydroxy-2',4'-dicyano-azobenzene and 11 ml triethylamine in 400 ml THF, with the temperature being held at 5° C. The batch was stirred at room temperature overnight, and the reaction solution was thereafter treated with 500 ml chloroform and was shaken 5 times with 300 ml water each time. The organic phase was dried over anhydrous magnesium sulphate. After distilling off the solvent, the solid residue was recrystallised from ethanol. 21.6 g of orange-red crystals were obtained, which had an f.p. of 172–173° C. $\lambda_{max}$=349 nm (DMF).

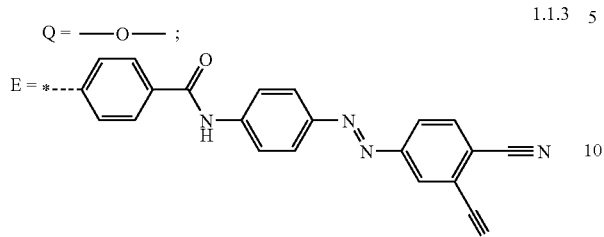

1.1.3

12 g 3,4-dicyanoaniline were diazotised analogously to 1.1.2. The reaction mixture was slowly added, at 0 to 5° C., to a solution of 6.5 g aniline in 60 ml glacial acetic acid, and was stirred at room temperature overnight. The precipitate was filtered off under suction, washed with water and dried. 12 g of red 4-amino-3',4'-dicyano-azobenzene were obtained, and were used further without purification. The further synthesis of the monomer was effected analogously to 1.1.1. Monomer 1.1.3 had an f.p. of 160–161° C. and $\lambda_{max}$=392 nm (DMF).

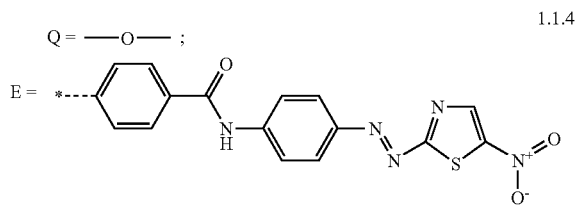

1.1.4

This monomer was prepared analogously to 1.1.3. It had an f.p. of 207–208° C. and $\lambda_{max}$=456 nm (DMF).

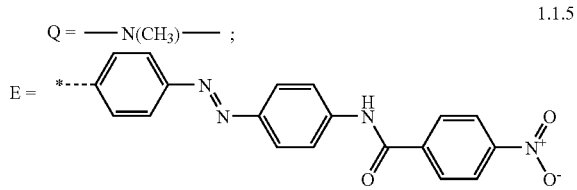

1.1.5 a) 38.6 g 4-(4-nitrobenzoylamino)-aniline were dissolved in a mixture of 207 ml glacial acetic acid. 72 ml propionic acid and 3 ml of 30% hydrochloric acid. 49.7 g of 40% nitrosylsulphuric acid were added thereto at 0–5° C. over 1 hour. The batch was then stirred for a further 2 hours at 0–5° C.

b) 32.8 g N-methyl-N-(2-methacryloyloxy-ethyl)-aniline (method 1.1.6) were dissolved in 130 ml glacial acetic acid. The diazotisation solution from a) was added thereto at 5–10° C. over 1 hour, the pH being maintained at 3 by the drop-wise addition of 20% aqueous sodium carbonate solution. The batch was subsequently stirred overnight at a pH of 3. The suspension was filtered off under suction. The product, which was still moist, was suspended in 500 ml water. The pH was increased to 7 by adding 20% aqueous sodium carbonate solution. The product was again filtered off under suction, washed with 200 ml water and dried under vacuum at 50° C. 56.2 g (77% theoretical)

of an orange-red powder were obtained, which had an f.p. of 198° C. In DMF, the product exhibited an absorption maximum at 430 nm and a shoulder at 447 nm.

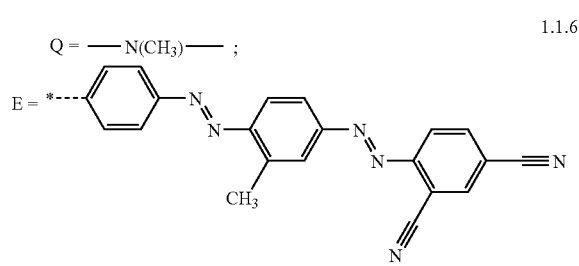

1.1.6

N-methyl-N-(2-methacryloyloxy-ethyl)-aniline was prepared in the following manner:

from methacrylic chloride:

100 g N-methyl-N-(2-hydroxyethyl)-aniline were dissolved in 100 ml chloroform. 182.6 g triethylamine and 137.2 g methacrylic chloride were slowly added drop-wise thereto at 40° C., with stirring, and the batch was stirred at 40° C. overnight. Thereafter, the reaction solution was treated with 500 ml chloroform and was shaken 5 times with 200 ml water each time. The organic phase was dried over anhydrous magnesium sulphate, treated with copper(I) chloride, and, after distilling off the solvent, was distilled under high vacuum. The methacrylic ester of hydroxyethylaniline distilled over at 127–130° C./55 mbar as a liquid which was as clear as water. The yield was 49.5 g.

from methacrylic acid:

50 ml of conc. sulphuric acid were added drop-wise at room temperature, with stirring, to a solution of 100 ml N-methyl-N-(2-hydroxyethyl)-aniline, 265 ml methacrylic acid and 26.5 g hydroquinone in 398 ml chloroform. After standing overnight, the batch was heated and the water of reaction was removed azeotropically. After cooling, the pH was adjusted to between 7 and 8 with concentrated aqueous sodium carbonate solution, and the product was extracted from this solution by shaking with ether. The further procedure was as described above, and resulted in a yield of 56 g.

2-methyl-4-amino-2',4'-dicyanoazobenzene was synthesised analogously to 1.1.3 from 2,4-dicyano-aniline and o-toluidine. 4.1 g 2-methyl-4-amino-2',4'-dicyanoazobenzene were diazotised analogously to 1.1.2.

The reaction mixture was slowly added to a mixture of 3.5 g methyl-N-(2-methacryloyloxy-ethyl)-aniline and 5 g sodium carbonate in 100 ml methanol, whilst maintaining the temperature at 10° C. and maintaining the pH at 5 with sodium carbonate. The orange-coloured by-product was first precipitated and was filtered off. Thereafter, the reaction mixture was treated with a fresh portion of sodium carbonate. After some time, a violet precipitate was produced. This was filtered off, washed with water and dried. 2.1 g of a violet product were obtained, which had an f.p. of 163–165° C. and for which $\lambda_{max}$=536 nm (DMF).

1.1.7

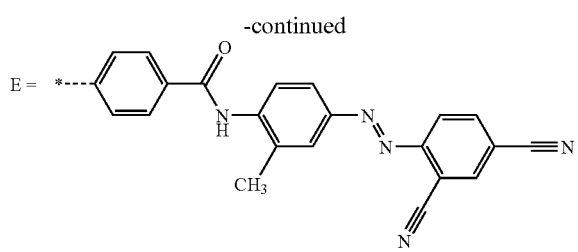

2-methyl-4-amino-2',4'-dicyanoazobenzene (method 1.1.6) was reacted with 4-(2-methacryloyloxy)-ethoxy-benzoic acid chloride analogously to 1.1.1. Orange-coloured crystals were obtained, which had an f.p. of 182–184° C. and for which $\lambda_{max}$=389 nm (DMF).

1.1.8

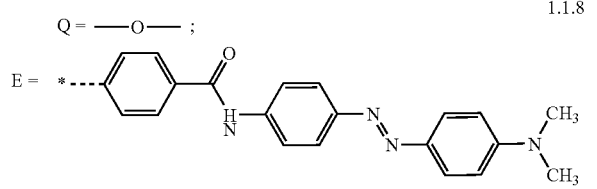

4-amino-4'-dimethylaminoazobenzene was reacted with 4-(2-methacryloyloxy)-ethoxy-benzoic acid chloride analogously to 1.1.1. Orange-coloured crystals were obtained, which had an f.p. of 218 220° C. and for which $\lambda_{max}$=428 nm (DMF).

1.1.9

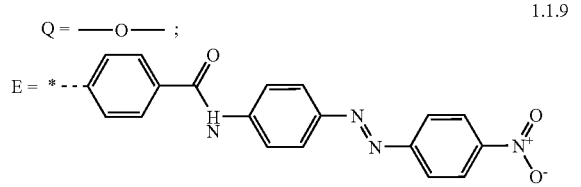

4-amino-4'-nitroazobenzene (disperse orange 3) was reacted with 4-(2-methacryloyloxy)-ethoxy-benzoic acid chloride analogously to 1.1.1. Orange-coloured crystals were obtained, which had an f.p. of 202° C. and for which $\lambda_{max}$=391 nm (DMF).

1.1.10

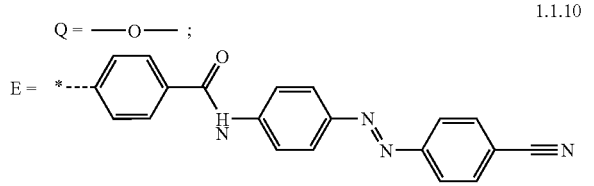

8.6 g 4-Cyanoaniline were diazotised, analogously to 1.1.2. The reaction mixture was slowly added at 5 to 10° C. to a solution of 6.5 g aniline and 3 g urea in 60 ml water and was stirred at room temperature overnight. The precipitate was filtered off under suction, washed with water and dried. 6.9 g of the orange-coloured 4-imino-4'-cyano-azobenzene were obtained, and were used further without purification.

The further synthesis of the monomer was effected analogously to 1.1.1. Monomer 1.1.10 had an f.p. of 174° C., and exhibited a liquid crystalline phase up to 204° C.; $\lambda_{max}$=380 nm (DMF).

1.1.11

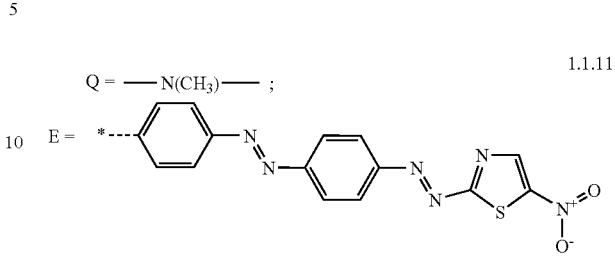

7 g 4-(5-nitro-2-thiazolylazo)aniline (method 1.1.4) wwere diazotised, analogously to 1.1.2. The reaction mixture was slowly added to a solution of 6.2 g N-methyl-N-(2-methacryloyloxy-ethyl)-aniline and 1 g urea in 30 ml of glacial acetic acid, whilst the temperature was maintained at 10° C. After stirring for a further 1 hour, the reaction mixture was poured on to ice. The precipitate was filtered off, washed with water and dried. 10.1 g of dark blue crystals were obtained, which had an f.p. of 207° C. and for which $\lambda_{max}$ 589 nm (DMF).

1.1.12

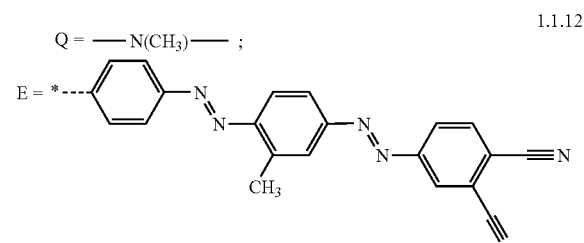

2-methyl-4-amino-3',4'-dicyano-azobenzene (method 1.1.6) was reacted with Nmethyl-N-(2-methacroyloxy-ethyl)-aniline, analogously to 1.1.1. Violet crystals were obtained, which had an f.p. of 164° C. and for which $\lambda_{max}$=521 nm (DMF).

1.1.13

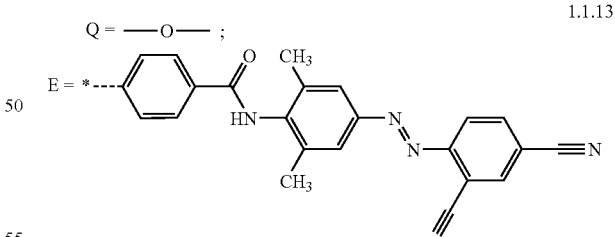

2,5-dimethyl-4-amino-2',4'-dicyano-azobenzene was synthesised from 2,4-dicyanoaniline and 2,5-dimethylaniline, analogously to 1.1.3.

5.5 g 2,5-dimethyl-4-amino-2',4'-dicyano-azobenzene in 200 ml dioxane were added to a solution of 5.9 g 4-(2-methacryloyloxy)-ethoxy-benzoic acid chloride in 40 ml dioxane, the batch was boiled under reflux for 48 hours with stirring, and the product was precipitated by pouring the solution into water. The precipitate was filtered off under suction, dried, and purified by recrystallising it twice from dioxane. The yield was 6.0 g of orange-red crystals with an f.p. of 200–202° C. $\lambda_{max}$=367.5 nm (DMF).

1.2 Preparation of the Homopolymer 7.9 g monomer 1.1 were polymerised at 70° C. in 75 ml DMF, under argon as a protective gas, and using 0.39 g azobis(isobutyronitrile) as the polymerisation initiator. After 24 hours, the batch was filtered, the DMF was distilled off, and the residue was boiled with methanol to remove unreacted monomer and was dried at 120° C. under high vacuum. 7.18 g of an amorphous polymer were obtained, which had a glass transition temperature of 150° C. and the optical properties of which are given in Example 2.1.1.

An analogous procedure was employed for the production of other polymers.

Example 2

Production of Light-induced Birefringence

Production of test samples: glass plates of size 2×2 cm and thickness 1.1 mm were placed in a spin coater (Suss RC 5 type of construction) and were coated with 0.2 ml of a solution of 150 g of the polymers listed below in 1 litre of absolute tetrahydrofuran at 2000 rpm for 10 seconds. The film was 0.9 μm thick, transparent and amorphous. The surface appeared uniformly dark between crossed polarisers in daylight.

The test plates were exposed using an Ar ion laser with an output of 60, 120 or 250 mV at a wavelength of 514 nm, whereupon birefringence was observed. The maximum birefringence Δn which could be obtained in the polymer film was determined in two steps:

Firstly, the maximum inducable path difference Δλ which produced a brightening effect between crossed polarisers was determined by a measurement using an Ehringhaus compensator. A quantitative determination was made by compensating for the brightening effect. This was effected by rotating a quartz crystal which had been moved into the beam path and which altered the optical path length and thus the path difference. The path difference at which the brightening effect was fully compensated for was then determined. This measurement had to be made using light of a wavelength outside the absorption range of the compounds, in order to avoid resonance effects. As a rule, a He—Ne laser with an emission wavelength of 633 nm is satisfactory. For long-wave absorptions, measurements are made using a diode laser of wavelength 820 nm. The read-out wavelength employed is given in the following Tables under the column heading "λ".

In a second step, the film thickness of the polymer was measured using a film thickness measuring instrument with a mechanical mode of action (Alphastep 200; manufactured by Tencor Instruments).

The change in birefringence Δn was determined from the quotient comprising the path difference Δλ divided by the film thickness d:

$$\Delta n = \frac{\Delta \lambda}{d}$$

The absorption maxima were determined by evaluating the UV/visible absorption spectra.

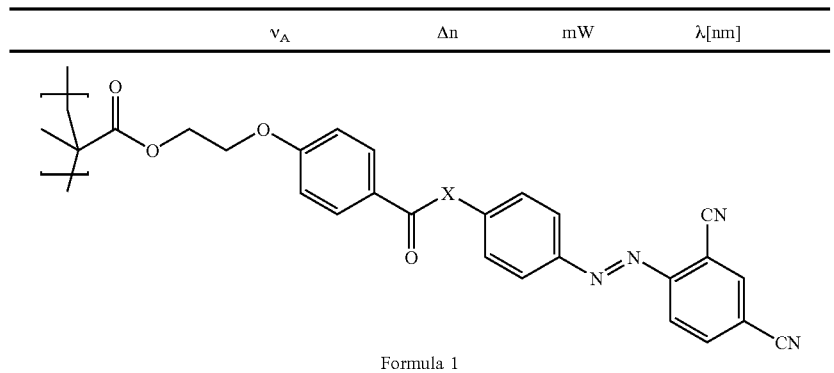

Formula 1

Example 2.1

| | $v_A$ | Δn | mW | λ[nm] |
|---|---|---|---|---|
| 2.1.1 X = NH | 25380 | 0.278 | 60 | 633 |
| 2.1.2 X = O | 29200 | 0.134 | 60 | 633 |

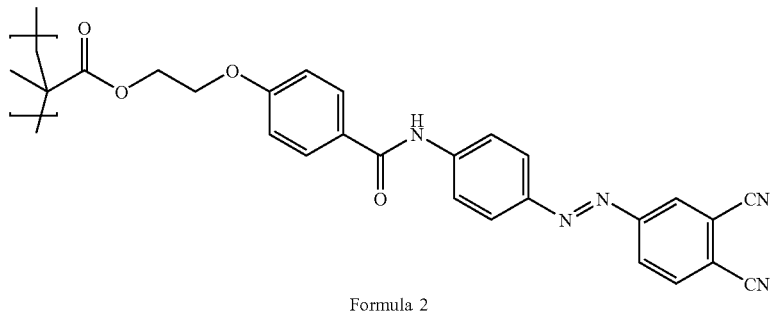

Formula 2

-continued
|  | $\nu_A$ | $\Delta n$ | mW | $\lambda$[nm] |
|---|---|---|---|---|
Example 2.2
26000    0.244    250    820
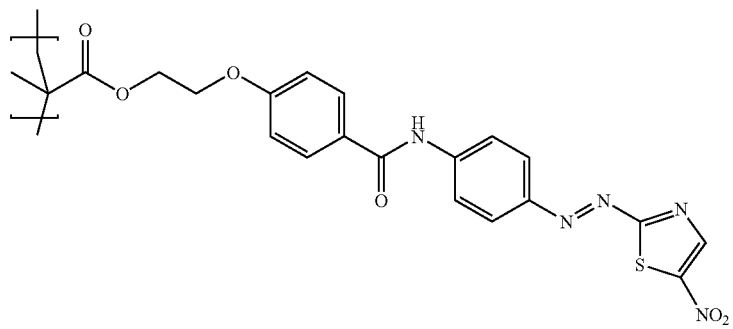
Formula 3
Example 2.3
23800    0.094    120    820
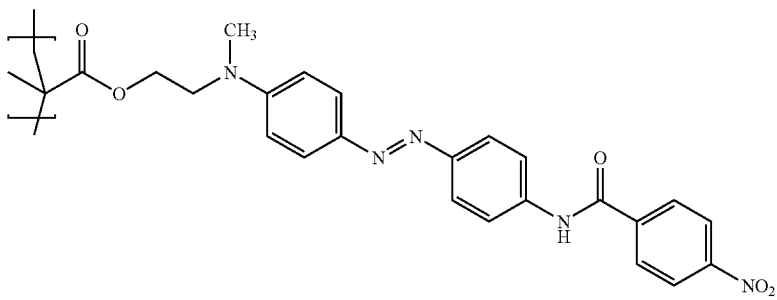
Formula 4
Example 2.4
20800    0.233    250    633
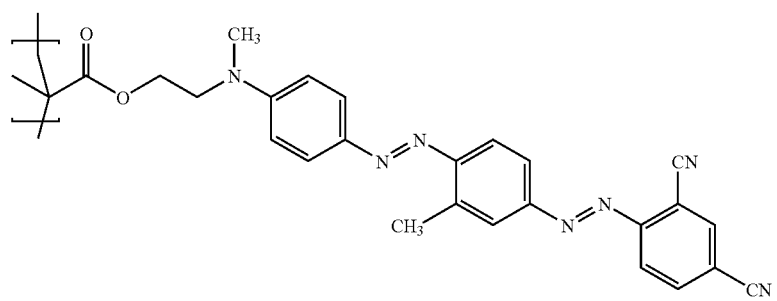

-continued
|  | $\nu_A$ | $\Delta n$ | mW | $\lambda$[nm] |
|---|---|---|---|---|
|  | Formula 5 | | | |
| Example 2.5 | | | | |
|  | 27855; 19380 | 0.194 | 250 | 820 |
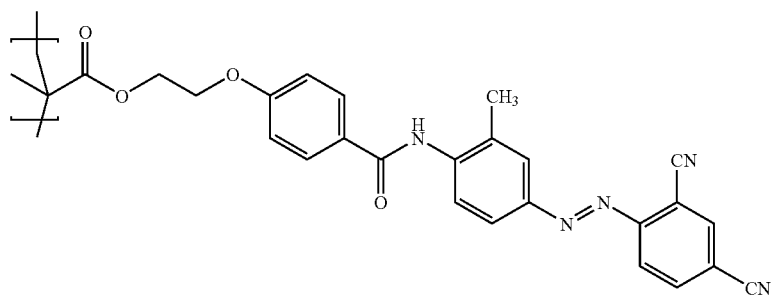
Formula 6
Example 2.6
|  | 26000 | 0.097 | 250 | 820 |
|---|---|---|---|---|
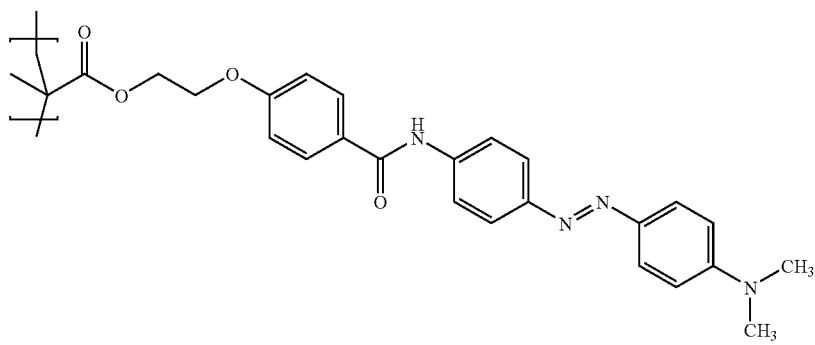
Formula 7
Example 2.7
|  | 25000 | 0.127 | 250 | 820 |
|---|---|---|---|---|
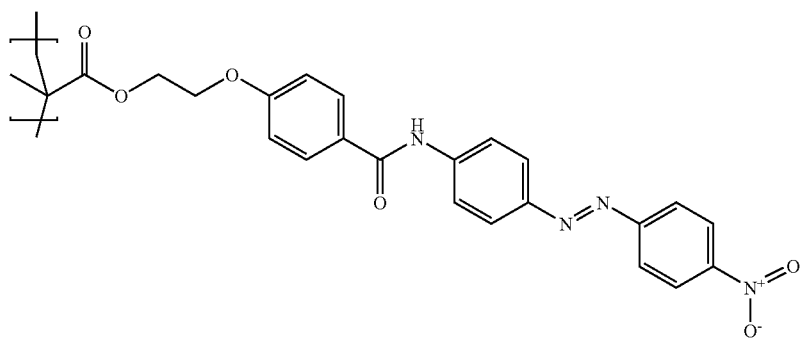
Formula 8
Example 2.8
|  | 27400 | 0.145 | 250 | 820 |
|---|---|---|---|---|

What is claimed is:

1. A homopolymer formed from a monomer represented by the following formula,

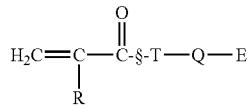

wherein,

R is H or methyl,

§ denotes a member selected from the group consisting of oxygen, sulfur and NR$^1$, T denotes a (CH$_2$)$_n$ radical, optionally interrupted by a member selected from the group consisting of —O—, —NR$^1$— and —OSi(R$^1$)$_2$,O—, and optionally substituted by methyl or ethyl, R$^1$ representing a member selected from the group consisting of hydrogen and C$_1$–C$_4$ alkyl, n denotes the number 2, 3 or 4, Q denotes a divalent linking group, and E denotes an at least trinuclear group having nuclei selected from the group consisting of: 2,6-naphthylene; 1,4-phenylene; 6-membered heterocyclic radicals selected from the group consisting of

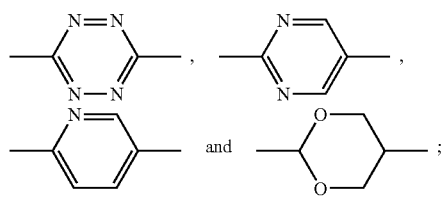

5-membered carbocyclic ring systems containing 3 hetero atoms selected from the group consisting of S, N and O; and 5-membered heteroaromatic ring systems containing 3 hetero atoms selected from the group consisting of S, N and O, each aromatic nuclei and each heterocyclic nuclei of said at least trinuclear group E is optionally and independently substituted with at least one member selected from the group consisting of C$_1$–C$_{12}$ alkyl, C$_1$–C$_{12}$ alkoxy, hydroxy, halogen, amino, nitro, trifluoromethyl, cyano, carboxy, COOR$^2$ (R$^2$ being selected from the group consisting of C$_1$–C$_6$ alkyl, cyclohexyl, benzyl and phenyl), C$_5$–C$_{12}$ cycloalkyl, C$_1$–C$_{12}$ alkylthio, C$_1$–C$_6$ alkylsulphonyl, C$_6$–C$_{12}$ arylsulphonyl, aminosulphonyl, C$_1$–C$_6$ alkylaminosulphonyl, phenylaminosulphonyl, aminocarbonyl, C$_1$–C$_6$ alkylaminocarbonyl, phenylaminocarbonyl, C$_1$–C$_4$ alkylamino, di-C$_1$–C$_4$ alkylamino, phenylamino, C$_1$–C$_5$ acylamino, C$_1$–C$_4$ alkylsulphonylamino, mono-C$_1$–C$_4$ alkylaminocarbonylamino, di-C$_1$–C$_4$ alkylaminocarbonylamino, C$_1$–C$_4$ alkoxycarbonylamino and trifluoromethyl-sulphonyl, and said at least trinuclear group E includes at least one polyvalent linking group, which is capable of undergoing a photo-induced change in configuration, selected from the group consisting of

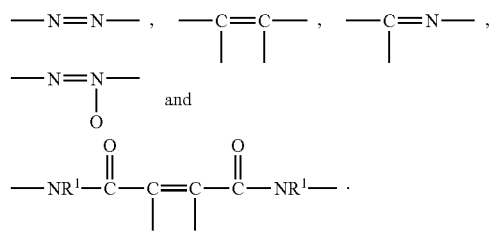

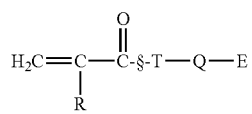

2. A process of preparing a homopolymer comprising homopolymerizing a monomer represented by the following formula,

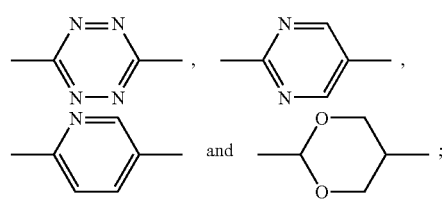

wherein,

R is H or methyl,

§ denotes a member selected from the group consisting of oxygen, sulfur and NR$^1$, T denotes a (CH$_2$)$_n$ radical, optionally interrupted by a member selected from the group consisting of —O—, —NR$^1$— and —OSi(R$^1$)$_2$,O—, and optionally substituted by methyl or ethyl, R$^1$ representing a member selected from the group consisting of hydrogen and C$_1$–C$_4$ alkyl, n denotes the number 2, 3 or 4, Q denotes a divalent linking group, and E denotes an at least trinuclear group having nuclei selected from the group consisting of: 2,6-naphthylene; 1,4-phenylene; 6-membered heterocyclic radicals selected from the group consisting of 5-membered carbocyclic ring systems containing 3 hetero atoms selected from the group consisting of S, N and O; and 5-membered heteroaromatic ring systems containing 3 hetero atoms selected from the group consisting of S, N and O, each aromatic nuclei and each heterocyclic nuclei of said at least trinuclear group E is optionally and independently substituted with at least one member selected from the group consisting of C$_1$–C$_{12}$ alkyl, C$_1$–C$_{12}$ alkoxy, hydroxy, halogen, amino, nitro, trifluoromethyl, cyano, carboxy, COOR$^2$ (R$^2$ being selected from the group consisting of C$_1$–C$_6$ alkyl, cyclohexyl, benzyl and phenyl), C$_5$–C$_{12}$ cycloalkyl, C$_1$–C$_{12}$ alkylthio, C$_1$–C$_6$ alkylsulphonyl, C$_6$–C$_{12}$ arylsulphonyl, aminosulphonyl, $C_1$–$C_6$-alkylaminosulphonyl, phenylaminosulphonyl, aminocarbonyl, $C_1$–$C_6$ alkylaminocarbonyl, phenylaminocarbonyl, $C_1$–$C_4$ alkylamino, di-$C_1$–$C_4$ alkylamino, phenylamino, $C_1$–$C_{15}$ acylamino, $C_1$–$C_4$ alkylsulphonylamino, mono-$C_1$–$C_4$ alkylaminocarbonylamino, di-$C_1$–$C_4$ alkylaminocarbonylamino, $C_1$–$C_4$ alkoxycarbonylamino and trifluoromethyl-sulphonyl, and said at least trinuclear group E includes at least one polyvalent linking group, which is capable of undergoing a photo-induced change in configuration, selected from the group consisting of $$-N=N-,\quad -\underset{|}{\overset{|}{C}}=\underset{|}{\overset{|}{C}}-,\quad -\underset{|}{\overset{|}{C}}=N-,$$

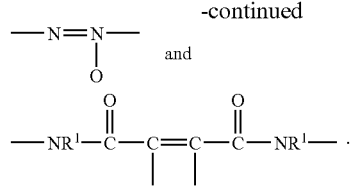

3. An article of manufacture comprising the homopolymer of claim 1, wherein said article of manufacture is selected from the group consisting of film, coating, optical storage component and holography component.

* * * * *